United States Patent
Wiesa

Patent Number: 5,375,039
Date of Patent: Dec. 20, 1994

[54] CIRCUIT BOARD HEAT DISSIPATION LAYERING ARRANGEMENT

[75] Inventor: Thomas Wiesa, Vaihingen, Germany

[73] Assignee: Robert Bosch GmbH, Stuttgart, Germany

[21] Appl. No.: 127,150

[22] Filed: Sep. 27, 1993

[30] Foreign Application Priority Data

Sep. 29, 1992 [DE] Germany .................. 4232575

[51] Int. Cl.⁵ .................................... H05H 7/20
[52] U.S. Cl. ................................ 361/720; 174/252; 361/690; 361/710
[58] Field of Search ............... 174/16.3, 252; 361/690, 361/704, 707–721

[56] References Cited

U.S. PATENT DOCUMENTS 4,628,407 12/1986 August et al. ............... 361/720
4,941,067 7/1990 Craft .
5,172,301 12/1992 Schneider .

FOREIGN PATENT DOCUMENTS 2207401 6/1974 France .
60-100457 10/1985 Japan .
02058358 5/1990 Japan .
1220370 1/1971 United Kingdom ........... 361/720

OTHER PUBLICATIONS

Research Disclosure; "Applying Thermal Transfer Compound Under Quadpads"; No. 319, Nov. 1990.

IBM Technical Disclosure Bulletin; "Thermal Enhancement for a Pritned Wiring Board, Thermal Finger Pad"; vol. 33, No. 4, Sep. 1990.

Primary Examiner—Gregory D. Thompson
Attorney, Agent, or Firm—Kenyon & Kenyon

[57] ABSTRACT

A circuit board layering arrangement is capable of dissipating, into a heat sink, the heat produced by power components mounted on the circuit board, without permitting the short circuiting of electricity between the power components and other components or the heat sink. The arrangement comprises a circuit board, at least one power component and a heat sink. A plurality of through contacts are introduced into the circuit board, and a plurality of conductive tracks are disposed on first and second surfaces of the circuit board. The plurality of conductive tracks include two large-surface conductive tracks, one on each surface of the circuit board. One or more power components are surface-mounted on a first surface of the circuit board on a first large-surface conductive track. The second large-surface conductive track is thermally coupled to the first large-surface conductive track and to the heat sink. A layer of metal, preferably copper, may be disposed between the second large-surface conductive track and the heat sink, and a layer of glass cloth may be disposed between the second large-surface conductive track and the layer of metal.

10 Claims, 3 Drawing Sheets

CIRCUIT BOARD HEAT DISSIPATION LAYERING ARRANGEMENT

FIELD OF THE INVENTION

The present invention relates to circuit board arrangements and, in particular, to heat dissipative circuit board layering arrangements.

BACKGROUND OF THE INVENTION

In known circuit board arrangements, a circuit board is covered on at least one of two main surfaces with a plurality of different voltage-carrying conductive tracks which must not be short-circuited to each other or to the heat sink. Thus, difficulty is frequently encountered in discharging to the heat sink the loss power produced in power components.

SUMMARY OF THE INVENTION

The present invention is directed to a circuit board heat dissipation layering arrangement which includes a circuit board, at least one power component and a heat sink. In particular, the circuit board has a first face and a second face, and a plurality of through contacts introduced therethrough. A plurality of conductive tracks are disposed on the first and second circuit board faces. The plurality of conductive tracks include a first large-surface conductive track which is disposed on the first circuit board surface and is electrically insulated from any other conductive tracks disposed on the first surface. One or more power components may be coupled to the first large-surface conductive track. A second large-surface conductive track of the plurality of conductive tracks is disposed on the second circuit board surface opposite the one or more power components and is coupled in thermal communication to the first large-surface conductive track by way of the plurality of through contacts. A heat sink is coupled in thermal communication with the second large-surface conductive track.

With the circuit board heat dissipation layering arrangement according to the present invention, the loss power produced in any power components disposed on the circuit board can be dissipated without electrical discharge to the heat sink or to conductive tracks other than the one on which the power components are mounted.

DETAILED DESCRIPTION OF THE INVENTION

Figure 1:
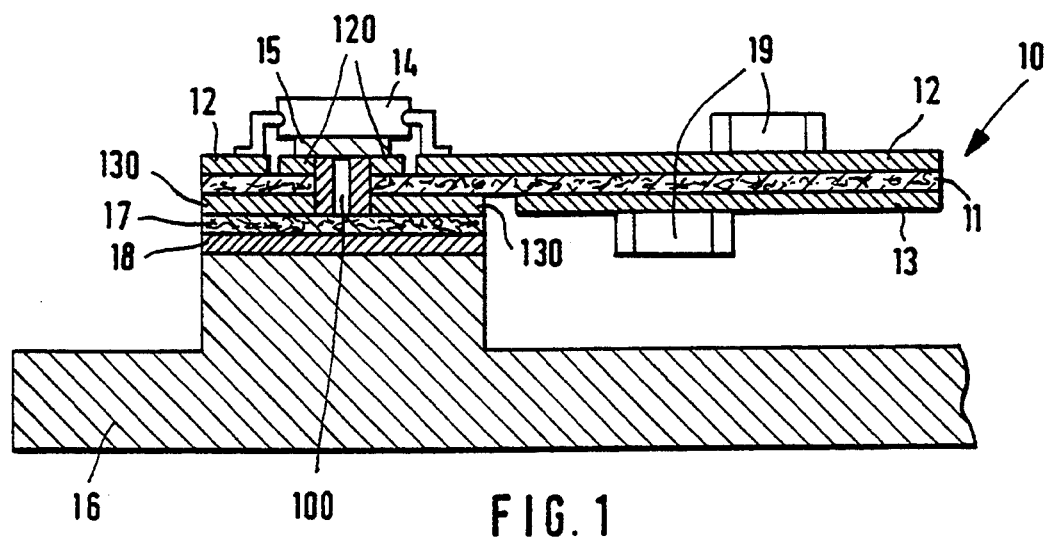
FIG. 1 shows a cross section of a first embodiment of an arrangement according to the present invention.

FIG. 1 shows, in cross section, a first embodiment of an arrangement according to the present invention. A circuit board 10 has a core 11 comprising glass cloth. On a first surface of the circuit board 10 is disposed a first network of conductive tracks 12 and, on a second surface, a second network of conductive tracks 13 on the top and bottom of which are arranged networks of conductive tracks 12 and 13, respectively. Disposed on the first surface of the circuit board 10, which may be an upper side of the circuit board 10, is a surface mount or SMD power component 14, which is connected to circuit board 10 via a heat discharge member 15. Heat discharge member 15 may comprise soft lead-tin solder or other suitable composition and is disposed in thermally conductive and electrical contact with a first large surface conductive track 120 disposed on the first surface of the circuit board 10. The first large-surface conductive track 120 is a part of the conductive-track network 12, but is electrically separated from the other conductive tracks of this network.

In the region of the power component 14, the circuit board 10 is placed on a heat sink 16. In order to couple the heat sink 16 in thermally conductive communication with the circuit board 10 and the power component 14, a second large-surface conductive track 130 is on a second surface of the circuit board 10, which may be the bottom of the circuit board 10, the large surface conductive track 130 being coupled in electrical and thermal communication to the first conductive track 120 by a plurality of through contacts 100. In FIG. 1, only one of these through contacts 100 is shown.

A layer of glass cloth 17 and a layer of metal 18, preferably copper, may be disposed between the circuit board 10 and the heat sink 16. The layer of glass cloth 17 is disposed adjacent to the circuit-board, while the layer of copper 18 is disposed adjacent to the heat-sink 16. The layer of copper 18 facilitates an advantageous distribution of heat and, at the same time, forms a flat resting surface for the heat sink 16. The layer of glass cloth 17 assures the electrical isolation of the power component 14 from the heat sink 16. The circuit board 10 bears further components 19, which may also be SMD parts, on its first and second sides, although they may not produce a particularly large amount of loss heat.

Figure 2:
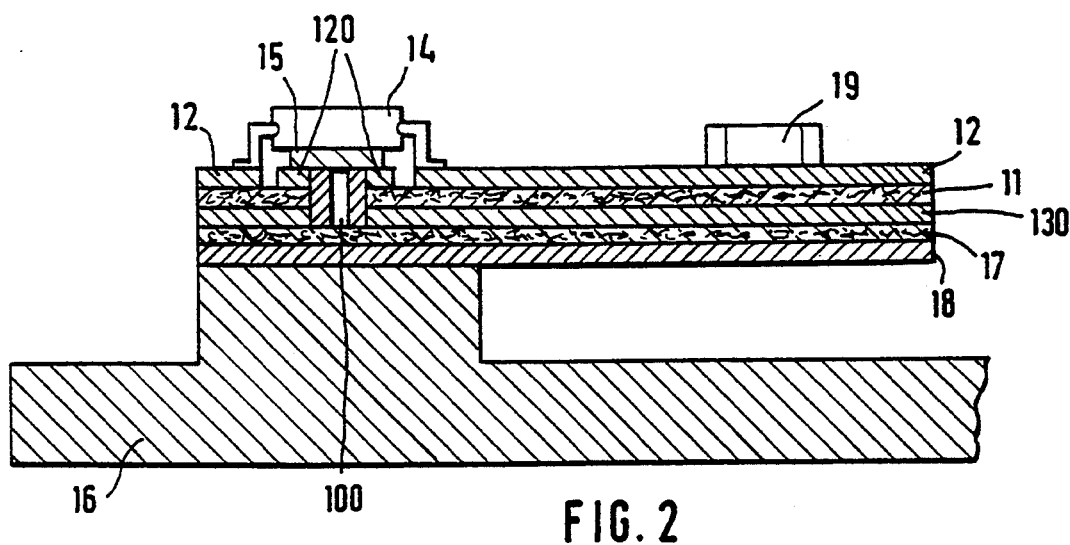
FIG. 2 shows a cross section of a second embodiment of an arrangement according to the present invention.

The embodiment shown in FIG. 2 differs from that shown in FIG. 1 in that the circuit board 10 shown in FIG. 2 bears further components 19, which may be SMD parts, on its first surface only. Furthermore, in this embodiment, the layers 130, 17, 18 extend over substantially the entire second surface of the circuit board 10. The heat sink 16, as in the embodiment shown in FIG. 1, is coupled to the layer of copper 18 only in the region of the SMD power component 14.

Figure 3:
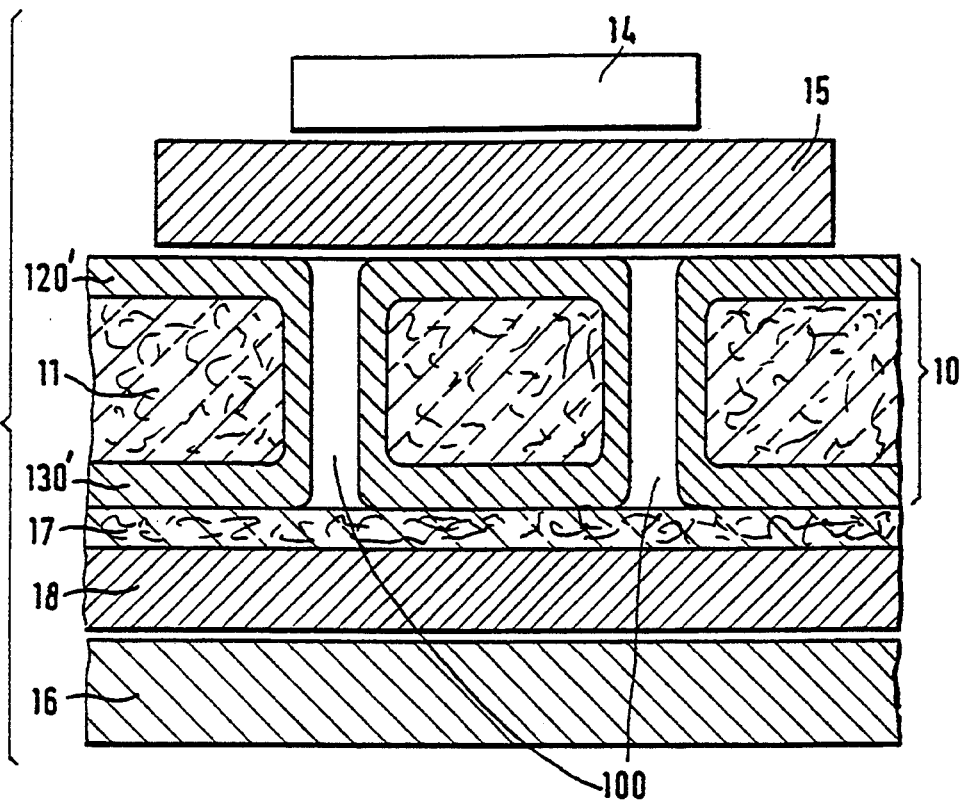
FIG. 3 is an enlarged, sectional view of an arrangement according to the present invention taken in the region of the through contacts.

FIG. 3 shows a sectional view of an arrangement according to the present invention in which layers 17, 18 and heat sink 16 are shown greatly enlarged in the region of the through contacts 100. The large-surface conductive tracks 120' and 130', which are arranged respectively on the first and second sides of the core 11 of glass cloth of the circuit board 10, preferably have a thickness of 35 micrometers each, although their thickness has been considerably increased by the application of soft solder. Furthermore, the circuit board 10 is provided in the region of the large-surface conductive tracks 120', 130' with a plurality of through contacts 100. These through contacts 100 comprise holes in the circuit board 10, each of which preferably is lined with a layer of copper with soft solder applied thereto. The glass-cloth layer 17 preferably has a thickness of more than 50 micrometers and the layer of copper 18 has a thickness preferably of more than 35 micrometers.

Figure 4:
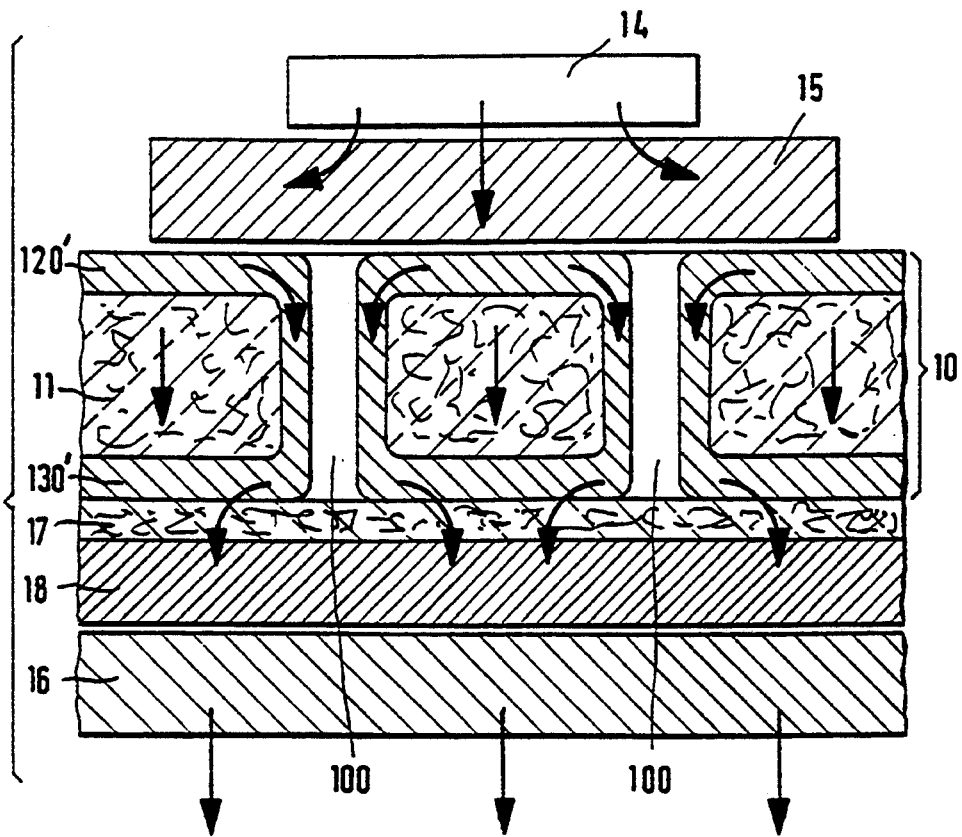
FIG. 4 is a sectional view as in FIG. 3, with heat flow being diagrammatically indicated.

FIG. 4 is a sectional view in accordance with FIG. 3, diagrammatically showing heat flow through the arrangement. A set of arrows indicates how the loss heat produced in the power component 14 is distributed initially over the heat-discharge member 15 and how this heat flows through the arrangement: from heat-discharge member 15 via the conductive track 120' and the through contacts 100 to the conductive track 130'; from conductive track 130 further via the glass-cloth layer 17 and the copper layer 18 to the heat sink 16; and from the heat sink 16 to the surrounding atmosphere, where it is led away, for instance, by a fan (not shown).

Figure 5:
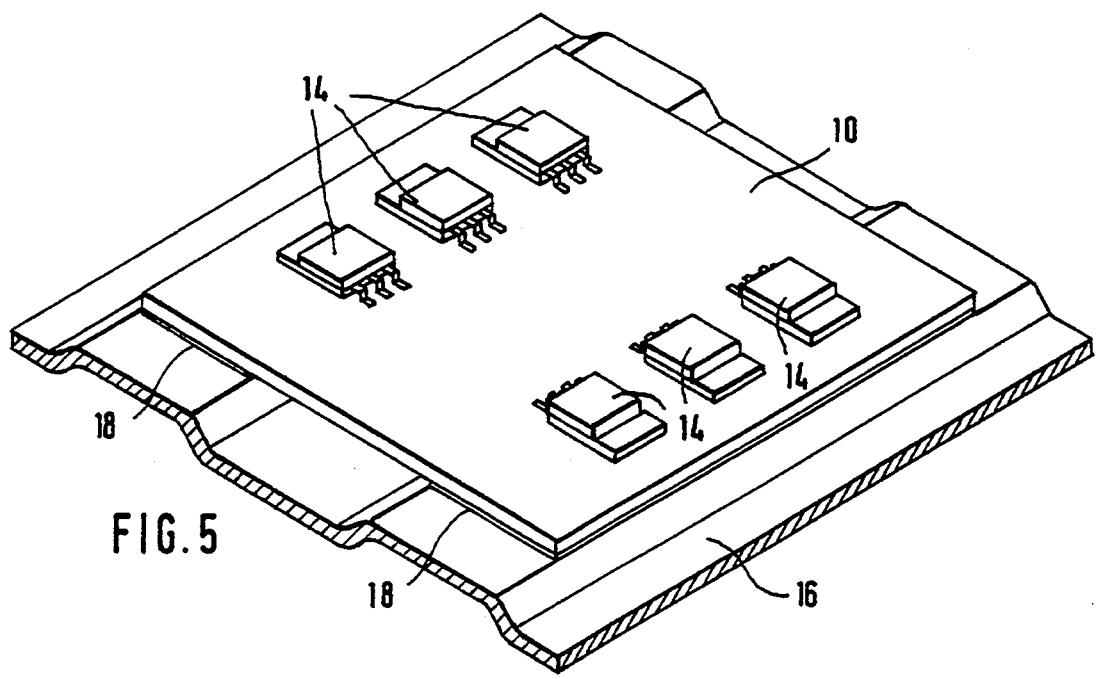
FIG. 5 is a perspective view of a third embodiment of an arrangement according to the present invention.

FIG. 5 shows a perspective view of circuit board 10 and heat sink 16, with a row of power components 14 arranged on the circuit board 10 along two opposite edges of the circuit board 10. Furthermore, in FIG. 5, a common heat sink 16 is provided for all power components 14. Below each of the two rows of power components 14, the heat sink 16 is attached directly to the circuit board 10 by separate layers of copper 18, without the interpositioning of a layer of glass cloth, so that the power components are connected in electrical communication with each other. In the region between the two rows of power components 14, the heat sink 16 is not in contact with the circuit board 10 but is at a distance from the circuit board 10, so that components can also be mounted on the second side of the circuit board 10.

Figure 6:
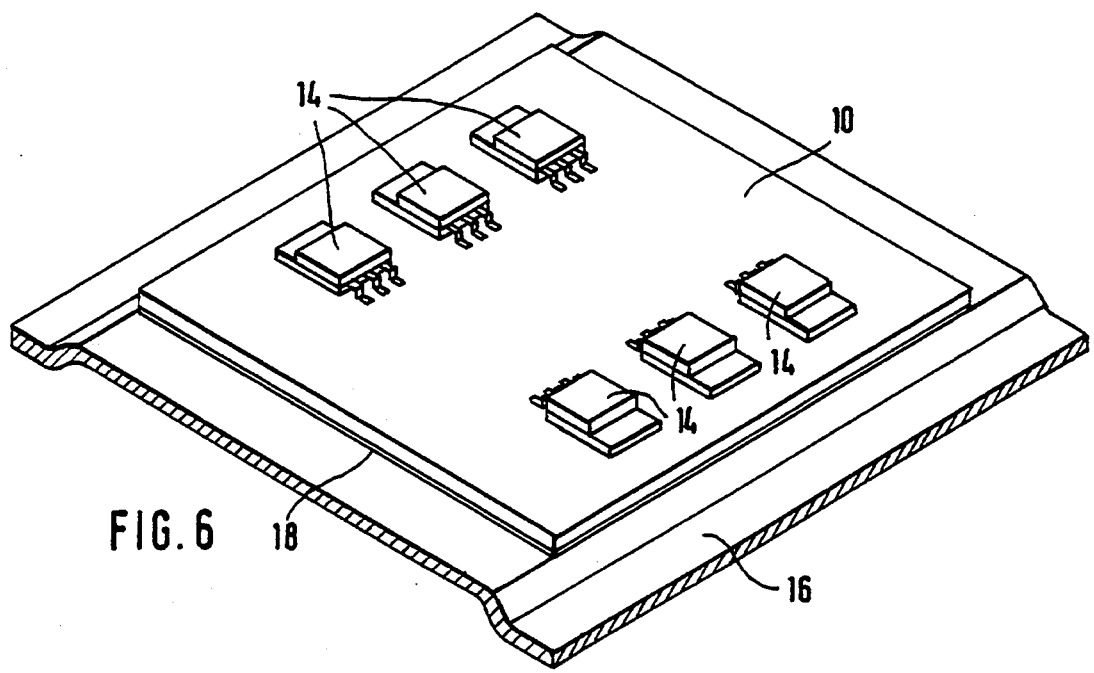
FIG. 6 is a perspective view of a fourth embodiment of an arrangement according to the present invention.

If no electrical components 19 are to be arranged on the bottom of the circuit board 10, then the layer of copper 18 and the heat sink 16 are disposed over their entire surfaces in contact with the circuit board 10, as shown in FIG. 6.

When the power components 14 are to be electrically separated from each other, it is also possible, in the case of the embodiments shown in FIGS. 5 and 6, as well as in the embodiments shown in FIGS. 1 and 2, to provide a layer of glass cloth 17 between the circuit board 10 and the copper layer 18.

What is claimed is:

1. A circuit board heat dissipation layering arrangement comprising
   a) a circuit board having a first face and a second face and a plurality of through contacts;
   b) a plurality of conductive tracks disposed on the first and second circuit board faces, the conductive tracks including a first large-surface conductive track disposed on the first circuit board surface and electrically insulated from any other conductive tracks disposed on the first surface;
   c) one or more power components coupled to the first large-surface conductive track;
   d) the conductive tracks further including a second large-surface conductive track disposed on the second circuit board surface opposite the one or more power components and coupled in thermal communication to the first large-surface conductive track by way of the plurality of through contacts; and a heat sink coupled in thermal communication to the second large-surface conductive track, wherein a layer of metal is disposed between the second large-surface conductive track and the heat sink, and wherein a layer of glass cloth is disposed between the second large-surface conductive track and the layer of metal.

2. The arrangement according to claim 1, wherein the layer of metal includes copper.

3. A circuit board heat dissipation layering arrangement comprising
   a) a circuit board having a first face and a second face and a plurality of through contacts;
   b) a plurality of conductive tracks disposed on the first and second circuit board faces, the conductive tracks including a first large-surface conductive track disposed on the first circuit board surface and electrically insulated from any other conductive tracks disposed on the first surface;
   c) one or more power components coupled to the first large-surface conductive track;
   d) the conductive tracks further including a second large-surface conductive track disposed on the second circuit board surface opposite the one or more power components and coupled in thermal communication to the first large-surface conductive track by way of the plurality of through contacts; and
   e) a heat sink coupled in thermal communication to the second large-surface conductive track, wherein a heat-discharge member is disposed between the one or more power components and the first large-surface conductive track, wherein a layer of metal is disposed between the second large-surface conductive track and the heat sink, and wherein a layer of glass cloth is arranged between the second large-surface conductive track and the layer of metal.

4. The arrangement according to claim 3, wherein the layer of metal is composed of copper.

5. A circuit board heat dissipation layering arrangement comprising
   a) a circuit board having a first face and a second face and a plurality of through contacts;
   b) a plurality of conductive tracks disposed on the first and second circuit board faces, the conductive tracks including a first large-surface conductive track disposed on the first circuit board surface and electrically insulated from any other conductive tracks disposed on the first surface;
   c) one or more power components coupled to the first large-surface conductive track;
   d) the conductive tracks further including a second large-surface conductive track disposed on the second circuit board surface opposite the one or more power components and coupled in thermal communication to the first large-surface conductive track by way of the plurality of through contacts;
   e) a heat sink coupled in thermal communication to the second large-surface conductive track;
   f) a heat discharge member disposed between the one or more power components and the first large-surface conductive track;
   g) a layer of metal disposed between the second large-surface conductive track and the heat sink; and
   h) a layer of glass cloth disposed between the second large-surface conductive track and the layer of metal.

6. The arrangement according to claim 5, wherein the layer of metal is composed of copper.

7. A method of arranging layers to dissipate heat from a circuit board comprising the steps of of:
   a) providing a circuit board having a first surface and a second surface;

b) introducing a plurality of through contacts into the circuit board;

c) disposing a plurality of first conductive tracks on the first circuit board surface; the first conductive tracks including a first large-surface conductive track electrically insulated from any other conductive tracks disposed on the first circuit board surface;

d) coupling one or more power components to the first large-surface conductive track;

e) disposing a plurality of second conductive tracks on the second circuit board surface, the second conductive tracks including a second large-surface conductive track disposed opposite the one or more power components and coupled in thermal communication to the first large-surface conductive track by way of the plurality of through contacts;

f) coupling a heat sink in thermal communication to the second large-surface conductive track; and g) disposing a layer of glass cloth between the second large-surface conductive track and the metal layer.

8. A method of arranging layers to dissipate heat from a circuit board comprising the steps of:

a) providing a circuit board having a first surface and a second surface;

b) introducing a plurality of through contacts into the circuit board;

c) disposing a plurality of first conductive tracks on the first circuit board surface, the first conductive tracks including a first large-surface conductive track electrically insulated from any other conductive tracks disposed on the first circuit board surface;

d) coupling one or more power components to the first large-surface conductive track;

e) disposing a plurality of second conductive tracks on the second circuit board surface, the second conductive tracks including a second large-surface conductive track disposed opposite the one or more power components and coupled in thermal communication to the first large-surface conductive track by way of the plurality of through contacts;

f) coupling a heat sink in thermal communication to the second large-surface conductive track;

g) disposing a heat discharge member between the one or more power components and the first large-surface conductive track; and h) disposing a layer of glass cloth between the second large-surface conductive track and the metal layer.

9. A method of arranging layers to dissipate heat from a circuit board comprising the steps of:

a) providing a circuit board having a first surface and a second surface;

b) introducing a plurality of through contacts into the circuit board;

c) disposing a plurality of first conductive tracks on the first circuit board surface, the first conductive tracks including a first large-surface conductive track electrically insulated from any other conductive tracks disposed on the first circuit board surface;

d) coupling one or more power components to the first large-surface conductive track;

e) disposing a plurality of second conductive tracks on the second circuit board surface, the second conductive tracks including a second large-surface conductive track disposed opposite the one or more power components and coupled in thermal communication to the first large-surface conductive track by way of the plurality of through contacts;

f) coupling a heat sink in thermal communication to the second large-surface conductive track;

g) disposing a layer of metal between the second large-surface conductive track and the heat sink; and h) disposing a layer of glass cloth between the second large-surface conductive track and the metal layer.

10. A method of arranging layers to dissipate heat from a circuit board comprising the steps of:

a) providing a circuit board having a first surface and a second surface;

b) introducing a plurality of through contacts into the circuit board;

c) disposing a plurality of first conductive tracks on the first circuit board surface, the first conductive tracks including a first large-surface conductive track electrically insulated from any other conductive tracks disposed on the first circuit board surface;

d) coupling one or more power components to the first large-surface conductive track;

e) disposing a plurality of second conductive tracks on the second circuit board surface, the second conductive tracks including a second large-surface conductive track disposed opposite the one or more power components and coupled in thermal communication to the first large-surface conductive track by way of the plurality of through contacts;

f) coupling a heat sink in thermal communication to the second large-surface conductive track;

g) disposing a heat discharge member between the one or more power components and the first large-surface conductive track;

h) disposing a layer of metal between the second large surface conductive track and the heat sink; and i) disposing a layer of glass cloth between the second large surface conductive track and the metal layer.

* * * * *

UNITED STATES PATENT AND TRADEMARK OFFICE
CERTIFICATE OF CORRECTION

PATENT NO. : 5,375,039
DATED : Dec. 20, 1994
INVENTOR(S) : WIESA

It is certified that error appears in the above-indentified patent and that said Letters Patent is hereby corrected as shown below:

Column 3, line 62, after "and" (begin new paragraph) and insert --(e)--;

Column 4, line 17, after "the" insert --one--;

Column 4, line 66, delete --of-- (second occurrence); and

Column 5, line 4, after "surfaces", ";" should be --,--.

Signed and Sealed this

Thirtieth Day of May, 1995

Attest:

BRUCE LEHMAN

Attesting Officer

Commissioner of Patents and Trademarks